(12) United States Patent
La Rue et al.

(10) Patent No.: US 7,456,768 B2
(45) Date of Patent: Nov. 25, 2008

(54) ANALOG-TO-DIGITAL CONVERTERS BASED ON AN INTERLEAVING ARCHITECTURE AND ASSOCIATED METHODS

(75) Inventors: George S. La Rue, Pullman, WA (US); Haidong Guo, Mountain View, CA (US)

(73) Assignee: Washington State University, Pullman, WA (US)

( * ) Notice: Subject to any disclaimer, the term of this patent is extended or adjusted under 35 U.S.C. 154(b) by 0 days.

(21) Appl. No.: 11/697,509

(22) Filed: Apr. 6, 2007

(65) Prior Publication Data

US 2007/0236380 A1   Oct. 11, 2007

Related U.S. Application Data

(60) Provisional application No. 60/790,275, filed on Apr. 7, 2006.

(51) Int. Cl.
*H03M 1/00* (2006.01)
(52) U.S. Cl. .................................. 341/141; 341/140
(58) Field of Classification Search .......... 341/130–155
See application file for complete search history.

(56) References Cited

U.S. PATENT DOCUMENTS

| | | | | |
|---|---|---|---|---|
| 4,380,716 A * | 4/1983 | Romeo et al. | .................. | 315/8 |
| 4,848,881 A * | 7/1989 | Kahan et al. | ................. | 359/288 |
| 4,881,078 A * | 11/1989 | Yamane et al. | .............. | 342/155 |
| 5,202,687 A * | 4/1993 | Distinti | ...................... | 341/158 |
| 5,638,072 A * | 6/1997 | Van Auken et al. | ......... | 341/141 |
| 6,373,896 B1 * | 4/2002 | Yoo | ....................... | 375/240.21 |

* cited by examiner

*Primary Examiner*—Lam T Mai
(74) *Attorney, Agent, or Firm*—Perkins Coie LLP

(57) ABSTRACT

An analog-to-digital converter based on an interleaving architecture is disclosed. The analog-to-digital converter can include a first sample and hold circuit for sampling and temporarily storing a first input signal. The analog-to-digital converter can also include a comparator for converting the sampled first input signal into a digital signal in a first time period. The analog-to-digital converter can further include a second sample and hold circuit for sampling and temporarily storing a second input signal in a second time period. The second time period at least partially overlaps with the first time period.

18 Claims, 5 Drawing Sheets

ANALOG-TO-DIGITAL CONVERTERS BASED ON AN INTERLEAVING ARCHITECTURE AND ASSOCIATED METHODS

CROSS REFERENCE TO RELATED APPLICATIONS

This application claims priority to U.S. Provisional Patent Application No. 60/790,275, filed 07 Apr. 2006, entitled "Interleaving Architecture for Reducing Analog to Digital Converter Power Dissipation".

STATEMENT REGARDING FEDERALLY SPONSORED RESEARCH OR DEVELOPMENT

This invention was made with government support under MH060623 awarded by the National Institutes of Health. The government has certain rights in the invention.

TECHNICAL FIELD

The present disclosure is related to analog-to-digital converter circuits, and more particularly to an interleaving analog-to-digital architecture.

BACKGROUND

Analog-to-digital converters (ADC) are electronic devices that can convert continuous signals (e.g., voltage, current, frequency, etc.) into signals representing binary, hexadecimal, or other types of discrete digital numbers. Successive approximation ADCs are one type of ADCs that convert analog signals to digital form by comparing the analog signals to series of reference signals until a best approximation is reached. Successive approximation ADCs can achieve good resolutions and wide dynamic ranges. However, operational amplifiers and/or other components used in successive approximation ADCs may require their own power supply and dissipate power in operation. As systems that incorporate ADCs become ever smaller, there is a need to reduce such power dissipation and/or increase the throughput of the ADCs.

DETAILED DESCRIPTION

Specific details of several embodiments of the disclosure are described below with reference to ADCs based on an interleaving architecture and methods for operating such ADCs. Moreover, several other embodiments of the invention may have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-5.

Figure 1:
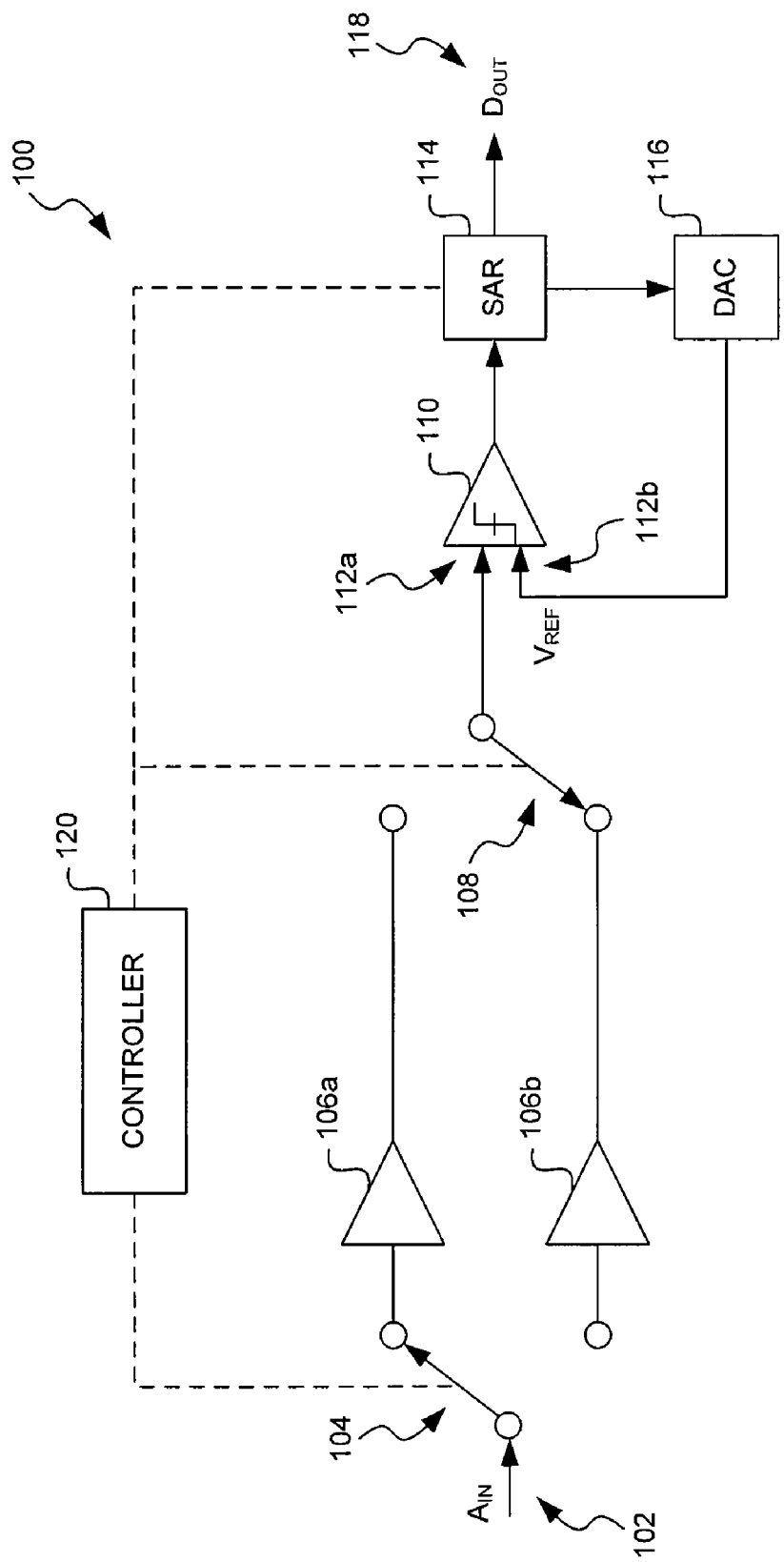
FIG. 1 is a schematic block view of an ADC based on an interleaving architecture and configured in accordance with an embodiment of the disclosure.

FIG. 1 is a schematic block view of an ADC 100 based on an interleaving architecture and configured in accordance with an embodiment of the disclosure. The ADC 100 can include a first sample and hold circuit (SHC) 106a and a second SHC 106b arranged generally in parallel to each other. The first and second SHC 106a-b are selectively connectable to an analog input $A_{IN}$ 102 via an input switch 104. The first and second SHC 106a-b can capture and at least temporarily store a copy of the input $A_{IN}$ 102 during operation. In one embodiment, individual first and second SHC 106a-b include at least one capacitors that can be charged with and hold a voltage corresponding to the input $A_{IN}$ 102. In other embodiments, individual first and second SHC 106a-b can also be implemented using resistors, operational amplifiers, and/or other suitable devices.

The ADC 100 can include a comparator 110. The comparator 110 can include a first input terminal 112a that is selectively connectable to the first or second SHC 106a-b via a comparator switch 108. The comparator 110 can also include a second input terminal 112b connected to a reference signal $V_{REF}$. The comparator 110 can compare the output from the first or second SHC 106a-b at the first input terminal 112a to the reference signal $V_{REF}$ at the second input terminal 112b and generate an output (e.g., a logic "1" or a logic "0") based on the comparison. The comparator 110 can be implemented using an operational amplifier that does not have a negative feedback and/or other suitable devices.

The ADC 100 can also include a successive approximation register (SAR) 114 and an internal digital-to-analog converter (DAC) 116 operatively coupled to the SAR 114. The SAR 114 can receive the output from the comparator 110 to generate an output 118 and supply estimated digital values of the input $A_{IN}$ 102 to the DAC 116. The DAC 116 can then generate an analog signal corresponding to the estimated digital values from the SAR 114 and supply the analog signal to the comparator 110 as the reference signal $V_{REF}$. The SAR 114 can be implemented using a plurality of flip-flops (e.g., D-flip-flops), core memory, thin film memory, and/or other suitable devices. The DAC 116 can be implemented as a pulse width modulator, a Delta-Sigma DAC, a binary weighted DAC, and/or other types of configurations.

The ADC 100 can further include a controller 120 operatively connected to the input switch 104, the comparator switch 108, and the SAR 114. The controller 120 can synchronize and/or otherwise affect the operation of these components during operation. For example, the controller 120 can move the input switch 104 to connect the second SHC 106b to the input $A_{IN}$ 102 while moving the comparative switch 108 to connect the comparator 110 to the first SHC 106a. In the illustrated embodiment, the controller 120 is shown as a stand alone device. In other embodiments, the controller 120 can be incorporated into and/or combined with the SAR 114, the DAC 116, and other components of the ADC 100.

In operation, the first SHC 106a can capture a first signal corresponding to the input $A_{IN}$ 102 when the controller 120 forces the input switch 104 to connect the first SHC 106a to the input $A_{IN}$ 102. After a certain period of time (e.g., 2 μs), the controller 120 can force the input switch 104 to disconnect the first SHC 106a from the input $A_{IN}$ 102 and connect the second SHC 106b to the input $A_{IN}$ 102. As a result, the second SHC 106b can capture a second signal of the input $A_{IN}$ 102. While the second SHC 106b is capturing the second signal, the controller 120 can force the comparator switch 108 to connect the output of the first SHC 106a to the first input terminal 112a of the comparator 110. The comparator 110 then performs bit cycling in which a binary search is conducted by comparing the first signal to multiple reference signals generated by the SAR 114 and the DAC 116. The SAR 114 then receives the result of the comparison and generates the digital output 118 based on the received results. Then, the controller 120 can force the input switch 104 to disconnect the second SHC 106b from the input $A_{IN}$ 102 and again connect the first SHC 106a to the input $A_{IN}$ 102. The comparator switch 108 then connects the output of the second SHC 106b to the first input terminal 112a of the comparator 110. The comparator 110 can then compare the second signal on the second SHC 106b to the referenced signal $V_{REF}$. This process can be repeated until the analog-to-digital operation ends.

The comparator 110 can operate generally continuously because the first and second SHC 106a-b can alternatively supply a signal to the comparator 110. In one embodiment, the operating period of the first and second SHC 106a-b can be generally the same as that of the comparator 110. As a result, charging one of the first and second SHC 106a-b and converting a signal from the other SHC into digital form can occur generally simultaneously. For example, the first SHC 106a can be charged while the comparator 110 converts a signal from the second SHC 106b into digital form during the same period of time, and vice versa. In other embodiments, there may be a short delay between two conversion periods of the comparator 110. For example, there may be a 1 μs delay after the comparator 110 converts the first signal from the first SHC 106a and before the comparator 110 converts the second signal from the second SHC 106b.

The ADC 100 can operate with reduced power consumption (e.g., in some embodiments, by a factor of 2). In conventional successive approximation ADCs, capacitors are charged and discharged quickly to allow the comparator enough time to perform bit cycling. Such rapid charging and discharging require a large amount of current in a short period of time, thus causing a high power requirement. As a result, the interleaving structure of the ADC 100 allows the capacitors 128a-b more time (e.g., the whole sampling time of the comparator 110) to get charged because the comparator 110 can alternatively sample the two capacitor arrays 121a-b. Thus, the power requirement of the buffer driving the capacitors 128a-b can be reduced. Moreover, in conventional ADCs, during such charging and discharging, the comparator and/or other components (e.g., a buffer) cannot easily be turned off and back on while maintaining adequate settling for high accuracy. Thus, the comparator and buffer consumers power even when not performing any functions. As a result, by generally continuously operating the comparator 110, the power consumed by the comparator 110 can be reduced for a desired throughput.

Even though the ADC 100 is illustrated as having two SHC 106a-b, in other embodiments, the ADC 100 can include more than two SHCs for alternatively supplying an input signal to the comparator 110. For example, the ADC 100 can include three, four, five, or any other desired number of SHC arranged generally in parallel. In further embodiments, the ADC 100 can include more than one comparators. For example, the ADC 100 can include one comparator coupled to each of the SHC 106a-b, and the output from the comparators can be selectively switched to the SAR 114. In the illustrated embodiment, the ADC 100 is illustrated as a successive approximation ADC, however, in other embodiments, the ADC 100 can be implemented as a direct conversion ADC, a delta-encoded ADC, a ramp-compare ADC, a pipeline ADC, and/or other types of ADC. Various embodiments of the ADC 100 can be incorporated into consumer electronics (e.g., digital cameras, voice recorders, camcorders, scanners, etc.), sensors (e.g., neural transmitters, pressure transmitters, etc.), and other types of electronic devices.

Figure 2:
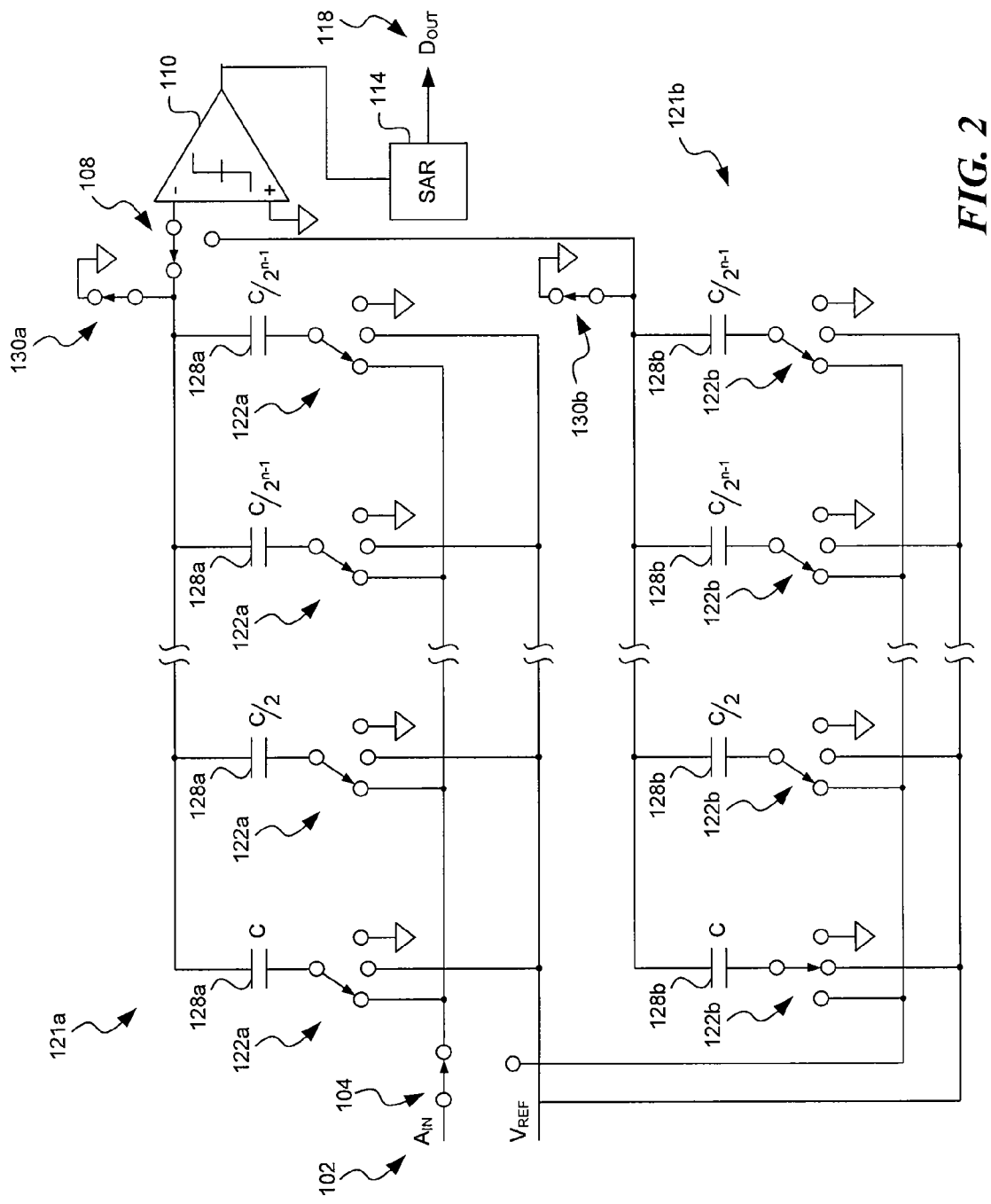
FIG. 2 is a schematic circuit diagram of the ADC of FIG. 1 implemented using a charge redistribution technique configured in accordance with an embodiment of the disclosure.

FIG. 2 is a schematic circuit diagram of the ADC 100 of FIG. 1 implemented using a unipolar charge redistribution technique and configured in accordance with an embodiment of the disclosure. In the illustrated embodiment, the ADC 100 can include a first capacitor array 121a and a second capacitor array 121b selectively connectable to the input $A_{IN}$ 102 via the input switch 104. The first and second capacitor arrays 121a-b can have many similar features. For example, the first and second capacitor arrays 121a-b can include corresponding capacitors with generally the same capacitance. As such, the features of the first capacitor array 121a are described below with reference symbols followed by an "a", and corresponding features of the second capacitor array 121b are shown and noted by the same reference symbol followed by a "b."

The first capacitor array 121a can include a plurality of capacitors 128a arranged generally in parallel to each other. Individual capacitors 128a can be a metal film capacitor, a Mica capacitor, a paper capacitor, a glass capacitor, a ceramic capacitor, an electrolytic capacitor, or other types of capacitor. The first capacitor array 121a can be binary weighted when individual capacitors 128a have a capacitance of C, C/2, C/4, ..., $C/2^{n-1}$, and $C/2^{n-1}$. C can be a desired capacitance for a particular application, and n is an integer greater than 1. As such, the first capacitor array 121a has a total capacitance $C_{total}$ that can be calculated as follows:

$$C_{total} = C_i + \frac{C_i}{2} + \frac{C_i}{4} + \ldots + \frac{C_i}{2^n} + \frac{C_i}{2^n} = 2C_i$$

Thus, the capacitor 128a with a capacitance of C would be exactly one half of the total capacitance. The capacitor 128a with a capacitance of $C/2^{n-1}$ would be $½^n$ of the total capacitance.

The first capacitor array 121a can include a plurality of capacitor switches 122a that can selectively connect a first plate of individual capacitors 128a to the input $A_{IN}$ 102, the reference signal $V_{REF}$, or the ground. The first capacitor array 121a can also include a hold switch 130a that can selectively connect a second plate of individual capacitors 128a to the ground.

In operation, the input switch 104 can be first set to the first capacitor array 121a, and the first capacitor switches 122a can be set to the input $A_{IN}$ 102 with the hold switch 130a connected to the ground. After a certain charging period, individual first capacitors 128a acquire an electrical charge corresponding to the input $A_{IN}$ 102 based on individual capacitance. Individual capacitor 128a would have acquired an electrical charge Q according to the following formula:

$$Q = C \times V$$

Where V is the voltage of the input $A_{IN}$ 102. As a result, the electrical charges on the first capacitors 128a are also binary weighted because of the capacitance of the first capacitors 128a is binary weighted. Thus, the first capacitor 128a having a capacitance of C would have twice amount of electrical charge than that having a capacitance of C/2.

After the first capacitors 128a are charged, the input switch 104 can be moved to connect the second capacitors 128b to the input $A_{IN}$ 102, and the first hold switch 130a can be opened to hold the electrical charges on the first capacitors 128a. As a result, individual capacitors 128a hold a voltage $V_{in}$ corresponding to the input $A_{IN}$ 102. Then, individual first capacitor switches 122a are moved to connect corresponding first capacitors 128a to the ground, and the hold switch 130a is opened. As a result, the voltage at the input of the comparator is $-V_{in}$. The first switch 122a connected individual capacitors 128a is set to $V_{REF}$, so that the voltage to the comparator becomes $V_{REF}-Vin$. The comparator 110 then compares the this voltage to the ground. If the difference has a higher voltage level than the ground, then the comparator 110 can output a logic "1" to the SAR 114, and the SAR 114 maintains the first switch setting; otherwise, a logic "0" is outputted to the SAR 114, and the SAR 114 resets the first switch to ground, By repeating this process successively for the second switch and then higher switches, a binary value for the input $A_{IN}$ 102 can be obtained.

While the comparator 110 compares individual first capacitors 128a to the reference voltage $V_{REF}$, the second capacitors 128b of the second capacitor array 121b are being charged. The charging period of the second capacitors 128b can at least overlap with the comparing period of the comparator 110. In one embodiment, the charging period can be generally the same as the comparing period. In another embodiment, the charging period can be shorter than the comparing period. As a result, the comparator 110 can process the captured signals on the second capacitors 128b after processing those on the first capacitors 128a. Then, the first capacitors 128a can be reset and charged with the input $A_{IN}$ 102 again.

Figure 3:
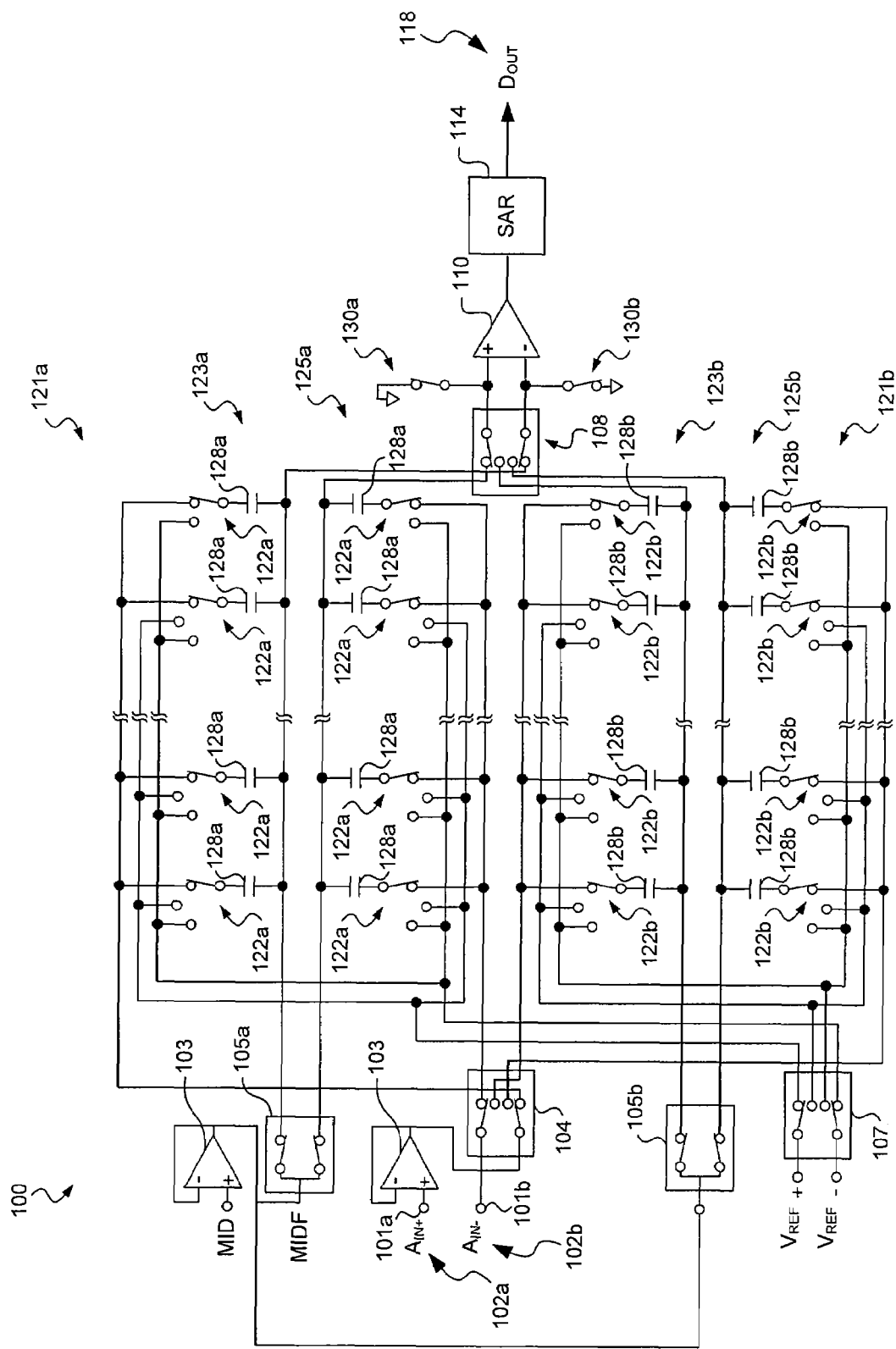
FIG. 3 is a schematic circuit diagram of the ADC of FIG. 1 implemented using a charge redistribution technique configured in accordance with another embodiment of the disclosure.

Even though the ADC 100, illustrated in FIG. 2, is unipolar and uses a single-ended input signal, the ADC 100 can perform signed conversions and use a differential input signal, as illustrated in FIG. 3. The ADC 100 can include a first terminal 101a to receive a positive input $A_{IN+}$ 102a and a second terminal 101b to receive a negative input $A_{IN-}$ 102b. The difference between the positive input $A_{IN+}$ 102a and the negative input $A_{IN-}$ 102b defines the input signal. The ADC 100 can also include an optional buffer 103 between the positive input $A_{IN+}$ 102a and the input switch 104. The buffer 103 can be implemented using an operational amplifier and/or other devices.

The ADC 100 can also include a first midpoint switch 105a connected to a midpoint signal MID via an optional buffer 105a. The midpoint signal MID represents a signal value at the middle point between the positive input $A_{IN+}$ 102a and the negative input $A_{IN-}$ 102b. In certain embodiments, the midpoint signal MID can be the ground. In other embodiments, the midpoint signal MID can have other values. For example, if the positive input $A_{IN+}$ 102a has a value of 5 volts, and the negative input $A_{IN-}$ 102b has a value of 1 volt, then the midpoint signal MID has a value of 3 volts.

In the illustrated embodiment, the first capacitor array 121a can include a first row 123a of capacitors 128a that can be selectively connected between a midpoint signal MID and either the positive input $A_{IN+}$ 102a, a positive reference signal $V_{REF+}$ or a negative reference signal $V_{REF-}$. The first capacitor array 121a can also include a second row 123b that can be selectively connected between a midpoint signal MID and either the negative of the input $A_{IN-}$ 102b, a positive reference signal $V_{REF+}$ or a negative reference signal $V_{REF-}$. The first row 123a and the second row 125a can include corresponding capacitors having similar features (e.g., generally the same capacitance). The ADC 100 can further include a reference switch 107 that can selectively connect a positive reference signal $V_{REF+}$ and a negative reference signal $V_{REF-}$ to the first and second capacitor arrays 121a-b.

In operation, the input switch 104, the first capacitor switches 122a, and the first midpoint switch 105a can connect the positive input $A_{IN+}$ 102a and the midpoint signal MID to the capacitors 128a in the first row 123a and the negative input $A_{IN-}$ 102b and the midpoint signal MID to those in the second row 125a. Then, the reference switch 107 can selectively connect the positive and negative reference signals to each pair of capacitors 128a in the first and second rows 123a, 125a. A binary search similar to the single-ended unipolar ADC is then performed starting with the largest capacitor 128a. The comparator 110 successively compares the voltages at its inputs to determine switch settings in the SAR 114. The process is repeated for the second and higher switches in the first and second rows 123a, 125a.

Figure 4:
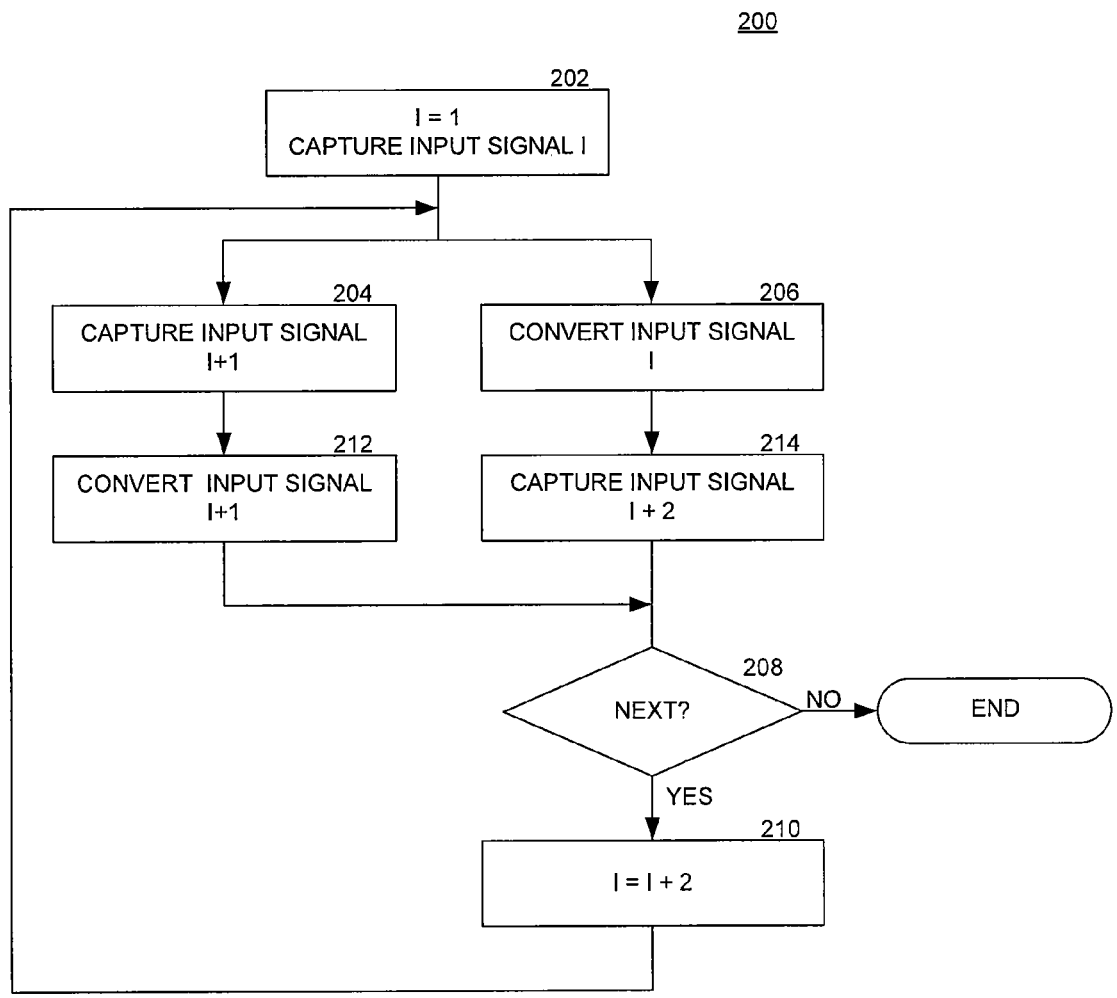
FIG. 4 is a flow chart illustrating a method of operating an ADC and configured in accordance with an embodiment of the invention.

FIG. 4 is a flow chart illustrating a method 200 of operating an ADC and configured in accordance with an embodiment of the invention. The method 200 includes capturing an input signal I (where I is an integer greater than 0), as in stage 202. After capturing the input signal I, the method includes capturing a new input signal I+1 in a first period, as in stage 204, and converting the captured signal I into digital form in a second period, as in stage 206. The first and second periods at least partially overlap. In one embodiment, the first and second periods are generally equal. In another embodiment, the first period is longer than the second period. In a further embodiment, the first period is shorter than the second period. The method also includes converting the captured input signal I+1, as in stage 212, and capturing another input signal I+2 generally simultaneously, as in stage 214. Then, a determination is made to decide whether more input signals need to be processed, as in stage 208. If no, then the process ends; otherwise, I is set to equal to I+2, as in stage 210. Then, the process reverts back to stage 204 and stage 206 for capturing the next input signal and converting the current input signal into digital form.

Figure 5:
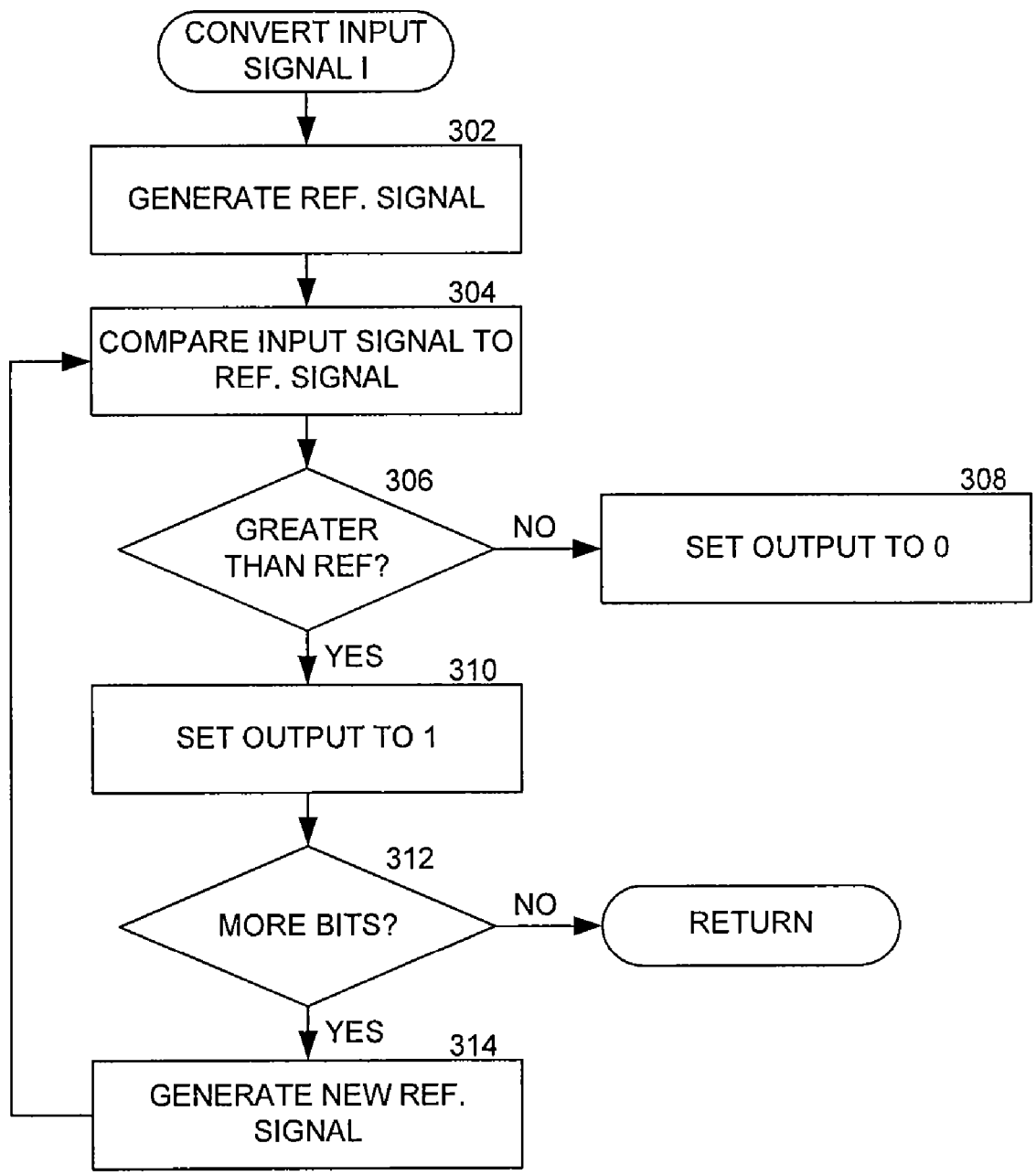
FIG. 5 is a flow chart illustrating a method of analog to digital conversion suitable for use in the method of FIG. 4.

FIG. 5 is a flow chart illustrating a method 300 for analog-to-digital conversion suitable for use in the method 200 of FIG. 4. The method 300 includes generating a reference signal $V_{REF}$, for example, by using a band gap voltage reference, as in stage 302. Then, the input signal is compared to the generated reference signal $V_{REF}$, as in stage 304. At stage 306, a determination is performed. If the input signal is smaller than the reference signal, then the current bit value for the input signal is reset to a logic "0", as in stage 308; otherwise, the current bit value remains a logic "1", as in stage 310. Another determination is performed in stage 312 to decide whether there are more bits to be generated for the input signal. If no, the process returns; otherwise, a new reference signal is generated based on a new initialized bit value and the previous reference signal following a binary search procedure. The process then reverts back to stage 304 to compare the input $A_{IN}$ 102 to the new reference signal.

From the foregoing, it will be appreciated that specific embodiments of the invention have been described herein for purposes of illustration, but that various modifications may be made without deviating from the invention. For example, many of the elements of one embodiment may be combined with other embodiments in addition to or in lieu of the elements of the other embodiments. Accordingly, the invention is not limited except as by the appended claims.

We claim:

1. An analog-to-digital converter, comprising:
   a first sample and hold circuit for sampling and temporarily storing a first input signal;

a comparator for converting the sampled first input signal into a digital signal in a first time period; and a second sample and hold circuit for sampling and temporarily storing a second input signal in a second time period, the second time period at least partially overlapping with the first time period, wherein the first sample and hold circuit includes an array of capacitors having binary weighted capacitance.

2. An analog-to-digital converter, comprising:

a first sample and hold circuit for sampling and temporarily storing a first input signal;

a comparator for converting the sampled first input signal into a digital signal in a first time period;

a second sample and hold circuit for sampling and temporarily storing a second input signal in a second time period, the second time period at least partially overlapping with the first time period;

a successive approximation register for initializing the digital signal; and an internal digital-to-analog converter for generating a reference signal based on the initialized digital signal.

3. An analog-to-digital converter, comprising:

a first sample and hold circuit for sampling and temporarily storing a first input signal;

a comparator for converting the sampled first input signal into a digital signal in a first time period; and a second sample and hold circuit for sampling and temporarily storing a second input signal in a second time period, the second time period at least partially overlapping with the first time period, wherein the second sample and hold circuit sampling and temporarily storing a second input signal generally simultaneously as the comparator converts the sampled first input signal into a digital signal.

4. An analog-to-digital converter, comprising:

a first sample and hold circuit for sampling and temporarily storing a first input signal;

a comparator for converting the sampled first input signal into a digital signal in a first time period;

a second sample and hold circuit for sampling and temporarily storing a second input signal in a second time period, the second time period at least partially overlapping with the first time period; and an input switch selectively connecting the first or second sample and hold circuit to the analog input and a comparator switch selectively connecting the first or second sample and hold circuit to the comparator.

5. An analog-to-digital converter, comprising:

a first sample and hold circuit for sampling and temporarily storing a first input signal;

a comparator for converting the sampled first input signal into a digital signal in a first time period;

a second sample and hold circuit for sampling and temporarily storing a second input signal in a second time period, the second time period at least partially overlapping with the first time period; and a controller for switching the first or second sample and hold circuit to the analog input and/or to the comparator.

6. An analog-to-digital converter, comprising:

a first sample and hold circuit for sampling and temporarily storing a first input signal;

a comparator for converting the sampled first input signal into a digital signal in a first time period; and a second sample and hold circuit for sampling and temporarily storing a second input signal in a second time period, the second time period at least partially overlapping with the first time period, wherein the first sample and hold circuit includes a first array of capacitors, and wherein the second sample and hold circuit includes a second array of capacitors.

7. The analog-to-digital converter of claim 6 wherein individual first and second arrays of capacitors are selectively connectable to at least one of the first and second input signals.

8. The analog-to-digital converter of claim 6 wherein individual first and second arrays of capacitors include capacitors having capacitance of $C, C/2, C/4, \ldots, C/2n-1$, and $C/2n-1$.

9. The analog-to-digital converter of claim 6 wherein a capacitor in the first array of capacitors has a capacitance that is generally the same as a corresponding capacitor in the second array of capacitors.

10. The analog-to-digital converter of claim 6 wherein individual first and second arrays of capacitors include a first and second rows of capacitors, capacitors in the first and second rows being generally identical.

11. An electronic device incorporating the analog-to-digital converter of claim 1.

12. An analog-to-digital converter, comprising:

first sampling means for sampling and temporarily storing a first input signal;

converting means for converting the sampled first input signal into a digital signal in a first time period;

second sampling means for sampling and temporarily storing a second input signal in a second time period, the second time period at least partially overlapping with the first time period;

means for initializing the digital signal; and means for generating a reference signal based on the initialized digital signal.

13. A method for converting an analog signal to a digital signal in an analog-to-digital converter, comprising:

sampling and temporarily storing a first input signal;

converting the sampled first input signal into a digital signal in a first time period; and sampling and temporarily storing a second input signal in a second time period, the second time period at least partially overlapping with the first time period, wherein sampling and temporarily storing a first input signal includes charging an array of capacitors having binary weighted capacitance.

14. A method for converting an analog signal to a digital signal in an analog-to-digital converter, comprising:

sampling and temporarily storing a first input signal;

converting the sampled first input signal into a digital signal in a first time period; and sampling and temporarily storing a second input signal in a second time period, the second time period at least partially overlapping with the first time period, wherein converting the sampled first input signal includes converting the sampled first input signal using successive approximation.

15. A method for converting an analog signal to a digital signal in an analog-to-digital converter, comprising:

sampling and temporarily storing a first input signal;

converting the sampled first input signal into a digital signal in a first time period;

sampling and temporarily storing a second input signal in a second time period, the second time period at least partially overlapping with the first time period;

initializing the digital signal;

generating a reference signal based on the initialized digital signal; and comparing the first input signal to the reference signal.

16. A method for converting an analog signal to a digital signal in an analog-to-digital converter, comprising:
   sampling and temporarily storing a first input signal;
   converting the sampled first input signal into a digital signal in a first time period; and
   sampling and temporarily storing a second input signal in a second time period, the second time period at least partially overlapping with the first time period, wherein sampling and temporarily storing a second input signal includes sampling and temporarily storing a second input signal generally simultaneously as converting the sampled first input signal into a digital signal.

17. A method for converting an analog signal to a digital signal in an analog-to-digital converter, comprising:
   sampling and temporarily storing a first input signal;
   converting the sampled first input signal into a digital signal in a first time period;
   sampling and temporarily storing a second input signal in a second time period, the second time period at least partially overlapping with the first time period; and
   converting the sampled second input signal into a digital signal while sampling and temporarily storing a third input signal.

18. A method for converting an analog signal to a digital signal in an analog-to-digital converter, comprising:
   sampling and temporarily storing a first input signal;
   converting the sampled first input signal into a digital signal in a first time period;
   sampling and temporarily storing a second input signal in a second time period, the second time period at least partially overlapping with the first time period; and
   reducing power consumption of the analog-to-digital converter by extending the first and/or the second time period near to the entire sample period.

* * * * *

UNITED STATES PATENT AND TRADEMARK OFFICE
CERTIFICATE OF CORRECTION

PATENT NO. : 7,456,768 B2
APPLICATION NO. : 11/697509
DATED : November 25, 2008
INVENTOR(S) : La Rue et al.

Page 1 of 1

It is certified that error appears in the above-identified patent and that said Letters Patent is hereby corrected as shown below:

In column 5, line 12, delete "Vin" and insert --$V_{in}$--, therefor.

In Claim 8, column 8, line 10, delete "C/2n-l, and C/2n-l" and insert --$C/2^{n-1}$, and $C/2^{n-1}$--, therefor.

Signed and Sealed this

Fourteenth Day of April, 2009

JOHN DOLL
*Acting Director of the United States Patent and Trademark Office*